United States Patent
Lee et al.

(10) Patent No.: US 9,735,396 B2
(45) Date of Patent: Aug. 15, 2017

(54) WHITE ORGANIC LIGHT EMITTING DIODE

(71) Applicant: SAMSUNG DISPLAY CO., LTD., Yongin, Gyeonggi-Do (KR)

(72) Inventors: Jaegoo Lee, Yongin-si (KR); Seil Kim, Hwaseong-si (KR)

(73) Assignee: SAMSUNG DISPLAY CO., LTD., Yongin, Gyeonggi-Do (JP)

( * ) Notice: Subject to any disclaimer, the term of this patent is extended or adjusted under 35 U.S.C. 154(b) by 115 days.

(21) Appl. No.: 14/752,372

(22) Filed: Jun. 26, 2015

(65) Prior Publication Data
US 2016/0181561 A1 Jun. 23, 2016

(30) Foreign Application Priority Data
Dec. 18, 2014 (KR) .................. 10-2014-0183238

(51) Int. Cl.
*H01L 51/50* (2006.01)
*H01L 51/52* (2006.01)

(52) U.S. Cl.
CPC ...... *H01L 51/5278* (2013.01); *H01L 51/5044* (2013.01); *H01L 51/5016* (2013.01)

(58) Field of Classification Search
USPC ............................................ 257/40, 79–103
See application file for complete search history.

(56) References Cited

U.S. PATENT DOCUMENTS

| | | | |
|---|---|---|---|
| 7,812,529 B2 | 10/2010 | Choi et al. | |
| 8,766,291 B2 | 7/2014 | Forrest et al. | |
| 9,196,838 B2 * | 11/2015 | Lim | C07C 13/00 |
| 9,276,227 B2 * | 3/2016 | Kim | H01L 51/006 |
| 9,425,410 B2 * | 8/2016 | Kim | H01L 51/0072 |
| 2011/0248249 A1 * | 10/2011 | Forrest | H01L 51/5016 257/40 |
| 2014/0361286 A1 * | 12/2014 | Jaeger | H01L 51/0078 257/40 |
| 2016/0254474 A1 * | 9/2016 | Zou | H01L 51/5221 |
| 2016/0260920 A1 * | 9/2016 | Rausch | H01L 51/0078 |

FOREIGN PATENT DOCUMENTS

| | | |
|---|---|---|
| KR | 10-2004-0074958 A | 8/2004 |
| KR | 10-2007-0067155 A | 6/2007 |
| KR | 10-2011-0104037 A | 9/2011 |
| KR | 10-2014-0030284 A | 3/2014 |
| KR | 10-2014-0055876 A | 5/2014 |

* cited by examiner

*Primary Examiner* — Ashok Patel
(74) *Attorney, Agent, or Firm* — Lee & Morse, P.C.

(57) ABSTRACT

A white organic light emitting diode including a first electrode; a second electrode facing the first electrode; a charge generation region between the first and second electrodes; a first emitting layer to emit light of a first color, the first emitting layer being between the first electrode and the charge generation region; and a second emitting layer to emit light of a second color, the second emitting layer being between the second electrode and the charge generation region, wherein the charge generation region includes a hole generation region to generate holes, an electron generation region to generate electrons, and a depletion prevention region to prevent a depletion region from being generated by the holes and the electrons, the depletion prevention region being between the hole generation region and the electron generation region.

20 Claims, 4 Drawing Sheets

WHITE ORGANIC LIGHT EMITTING DIODE

CROSS-REFERENCE TO RELATED APPLICATION

Korean Patent Application No. 10-2014-0183238, filed on Dec. 18, 2014, in the Korean Intellectual Property Office, and entitled: "White Organic Light Emitting Diode," is incorporated by reference herein in its entirety.

BACKGROUND

1. Field

Embodiments relate to a white organic light emitting diode.

2. Description of the Related Art

Flat panel display devices include a light emitting type and a light receiving type. The light emitting type flat panel display device may include a flat cathode ray tube, a plasma display panel, an organic light emitting display (OLED), and the like. The OLED (that is a self-light emitting type display), has advantages of a wide viewing angle, an excellent contrast, and a fast response rate.

SUMMARY

Embodiments are directed to a white organic light emitting diode.

The embodiments may be realized by providing a white organic light emitting diode including a first electrode; a second electrode facing the first electrode; a charge generation region between the first and second electrodes; a first emitting layer to emit light of a first color, the first emitting layer being between the first electrode and the charge generation region; and a second emitting layer to emit light of a second color, the second emitting layer being between the second electrode and the charge generation region, wherein the charge generation region includes a hole generation region to generate holes, an electron generation region to generate electrons, and a depletion prevention region to prevent a depletion region from being generated by the holes and the electrons, the depletion prevention region being between the hole generation region and the electron generation region.

The depletion prevention region may include a diamond-like carbon film.

A thickness of the diamond-like carbon film may be 0.1 nm to 10 nm.

The first and second colors may be in a complementary color relationship with each other.

A second wavelength of the second color may be longer than a first wavelength of the first color.

The first emitting layer may include a blue phosphorescent dopant material or a blue fluorescent dopant material.

The second emitting layer may include a yellow phosphorescent dopant material.

The second emitting layer may include a green phosphorescent dopant material.

The second emitting layer may include red and green phosphorescent dopant materials.

The white organic light emitting diode may further include a plurality of charge transport regions to transport the hole and the electron.

The plurality of charge transport regions may include a first charge transport region between the first electrode and the first emitting layer; a second charge transport region between the first emitting layer and the charge generation region; a third charge transport region between the charge generation region and the second emitting layer; and a fourth charge transport region between the second emitting layer and the second electrode.

The first electrode may be an anode, and the second electrode may be a cathode.

The first and third charge transport regions may transport holes, and the second and fourth charge transport regions may transport electrons.

The first electrode may be a cathode, and the second electrode may be an anode.

The first and third charge transport regions may transport electrons, and the second and fourth charge transport regions may transport holes.

The depletion prevention region may include a carbon nanotube or graphene.

The embodiments may be realized by providing a white organic light emitting diode including a first electrode; a second electrode facing the first electrode; first and second charge generation regions between the first and second electrodes; a first emitting layer to emit light of a first color, the first emitting layer being between the first electrode and the first charge generation region; a second emitting layer to emit light of a second color, the second emitting layer being between the first charge generation region and the second charge generation region; and a third emitting layer to emit light of a third color, the third emitting layer being between the second charge generation region and the second electrode, wherein each of the first and second charge generation regions includes a hole generation region to generate holes, an electron generation region to generate electrons, and a depletion prevention region to prevent a depletion region from being generated by the hole and the electron, the depletion prevention region being between the hole generation region and the electron generation region.

The depletion prevention region may include a diamond-like carbon film.

The depletion prevention region may include a carbon nanotube or graphene.

The first and third colors may be in a complementary color relationship with each other.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In this application, the terms "include" or "have" or the like used herein shall be construed as indicating the presence of features, numbers, steps, operations, elements, parts or combinations thereof described in the specification, and shall be understood so as not to exclude the presence or addition of one or more other features, numbers, steps, operations, elements, parts or combinations thereof. It will also be understood that when a layer, a film, a region, or a plate is referred to as being 'on' another layer, film, region or plate, it can be directly on the other layer, film, region or plate, or intervening layers, films, regions or plates may also be present. In contrast, it will be understood that when a layer, film, region or plate is referred to as being 'under' another layer, film, region or plate, it can be directly under the other layer, film, region or plate, or intervening layers, films, regions or plates may also be present.

Though terms like a first and a second are used to describe various components, the components are not limited to these terms. These terms are used only to differentiate one component from another one. For example, without departing from the scope herein, a first element could be termed a second element, and, similarly, a second element could be termed a first element. The terms of a singular form may include plural forms unless referred to the contrary.

Figure 1:
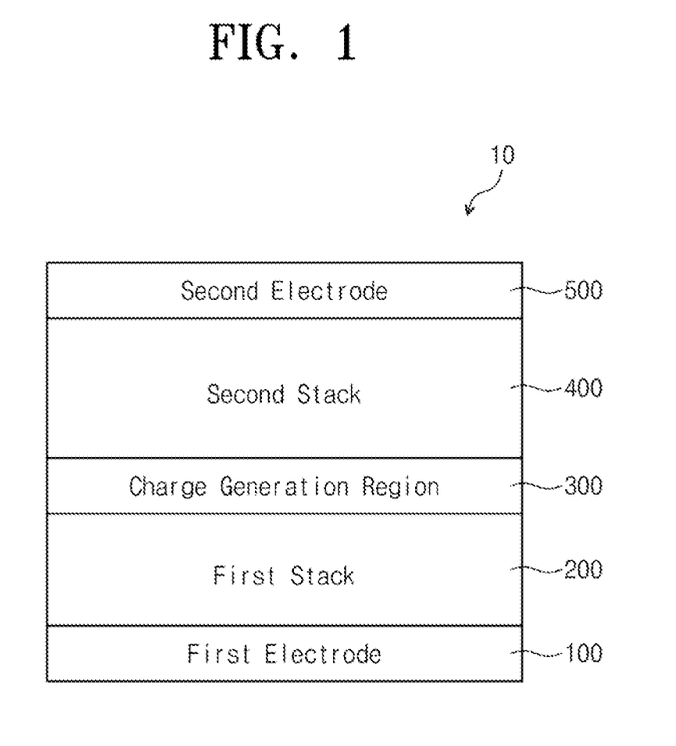
FIGS. 1 and 2 illustrate cross-sectional views of white organic light emitting diodes.
Figure 2:
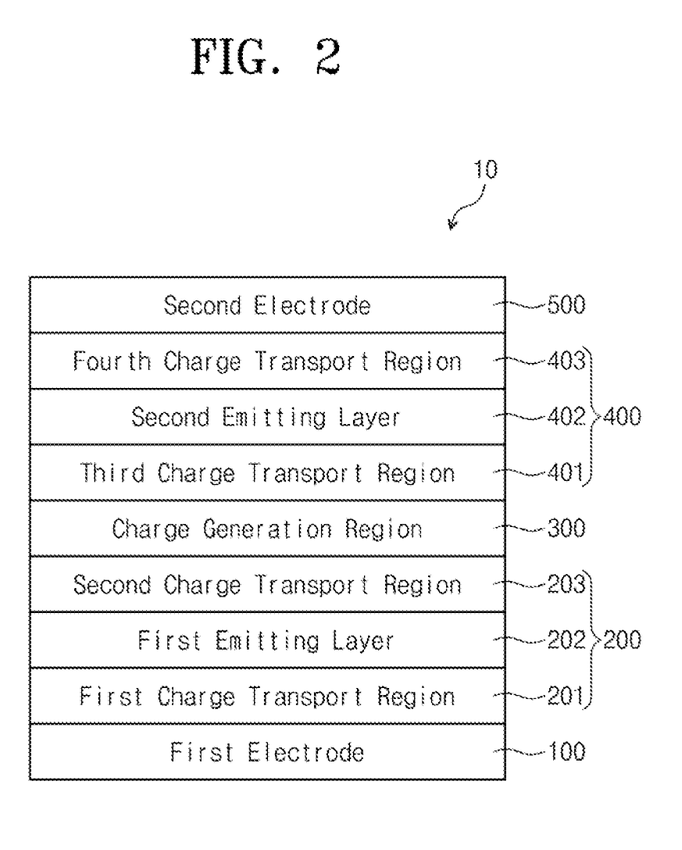

FIGS. 1 and 2 illustrate cross-sectional views of white organic light emitting diodes.

Referring to FIGS. 1 and 2, a white organic light emitting diode 10 may include first and second electrodes 100 and 500, first and second stacks 200 and 400, and a charge generation region 300.

The first electrode 100 may be a pixel electrode or an anode. The first electrode 100 may be a transmissive electrode, a semi-transmissive electrode, or a reflective electrode. When the first electrode 100 is a transmissive electrode, the first electrode 100 may be formed of a transparent metal oxide, e.g., indium tin oxide (ITO), indium zinc oxide (IZO), zinc oxide (ZnO), indium tin zinc oxide (ITZO). When the first electrode 100 is a semi-transmissive electrode or a reflective electrode, the first electrode 100 may include, e.g., Ag, Mg, Al, Pt, Pd, Au, Ni, Nd, Ir, Cr, or a mixture thereof.

The first electrode 100 may have a single-layer structure or a multi-layer structure, each layer being formed of a transparent metal oxide or a metal. For example, the first electrode 100 may have a single-layer structure formed of ITO, Ag or a metal mixture (e.g., a mixture of Ag and Mg), a two-layer structure of ITO/Mu or ITO/MgF, or a three-layer structure of ITO/Ag/ITO.

The second electrode 500 may be a common electrode or a cathode. The second electrode 500 may be a transmissive electrode, a semi-transmissive electrode, or a reflective electrode. When the second electrode 500 is a transmissive electrode, the second electrode 500 may include, e.g., Li, Ca, LiF/Ca, LiF/Al, Al, Mg, BaF, Ba, Ag, or a compound thereof, or a mixture thereof (e.g., a mixture of Ag and Mg).

The second electrode 500 may include an auxiliary electrode. The auxiliary electrode may include a film formed to face the emitting layer by depositing any of the foregoing materials, and a transparent metal oxide film on the film, the transparent metal oxide film being made of, e.g., indium tin oxide (ITO), indium zinc oxide (IZO), zinc oxide (ZnO), or indium tin zinc oxide (ITZO). Alternatively, the auxiliary electrode may include Mo, and Ti.

When the second electrode 500 is a semi-transmissive electrode or a reflective electrode, the second electrode 500 may include, e.g., Ag, Mg, Al, Pt, Pd, Au, Ni, Nd, Ir, Cr, Li, Ca, LiF/Ca, LiF/Al, Mo, Ti or a compound thereof, or a mixture thereof (e.g., a mixture of Ag and Mg). In an implementation, the second electrode 500 may have a multi-layer structure including a reflective film or semi-transmissive film formed of any of the materials, and a transparent conductive film formed of, e.g., indium tin oxide (ITO), indium zinc oxide (IZO), zinc oxide (ZnO), indium tin zinc oxide (ITZO) or the like.

When the white organic light emitting diode 10 is a top emission type organic light emitting diode, the first electrode 100 may be a reflective electrode, and the second electrode 500 may be a transmissive electrode or a semi-transmissive electrode. When the white organic light emitting diode 10 is a bottom emission type organic light emitting diode, the first electrode 100 may be a transmissive electrode or a semi-transmissive electrode and the second electrode 500 may be a reflective electrode.

Each of the first and second stacks 200 and 400 may include emitting layers 202 and 402 to emit color light. Each of the emitting layers 202 and 402 may be a single layer of a single material, or a single layer of a plurality of materials different form each other, or may have a multi-layer structure having a plurality of layers of a plurality of materials different from each other.

The emitting layers 202 and 402 may be formed by using any of various methods, e.g., vacuum deposition, spin coating, casting, a Langmuir-Blodgett method, an inkjet printing method, a laser printing method, and a laser induced thermal imaging (LITI) method.

In an implementation, the emitting layers 202 and 402 may be formed of a suitable material, e.g., a material emitting red, green, yellow-green, green, or blue light, and may include a fluorescent material or a phosphorescent material. In an implementation, the emitting layers 202 and 402 may include a host material and a dopant material.

In an implementation, the host material may include a suitable host material, e.g., tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-cert-butyl-9,10-di(naphth-2-yl)anthracene (TBADN), distyrylaiylene (DSA), 4,4'-bis(9-carbazolyl)-2, 2'-dimethyl-biphenyl (CDBP), 2-Methyl-9,10-bis(naphthalen-2-yl)anthracene (MADN) or the like.

When the emitting layers 202 and 402 emit red light, the emitting layers 202 and 402 may include, e.g., a fluorescent material including PBD:Eu(DBM)3(Phen)(tris(dibenzoyl-methanato)phenanthoroline europium) or perylene. When the emitting layers 202 and 402 emit red light, the dopant material included in the emitting layers 202 and 402 may be selected from a metal complex or an organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP).

When the emitting layers 202 and 402 emit green light, the emitting layers 202 and 402 may include, e.g., a fluorescent material including tris(8-hydroxyquinolino)aluminum (Alq3). When the emitting layers 202 and 402 emit green light, the dopant material included in the emitting layers 202 and 402 may be selected from a metal complex or an organometallic complex such as Ir(ppy)$_3$(fac-tris(2-phenylpyridine)iridium).

When the emitting layers 202 and 402 emit blue light, the emitting layers 202 and 402 may include, e.g., a fluorescent material including at least one of spiro-DPVBi, spiro-6P, distyryl-benzene (DSS), distyryl-arylene (DSA), Polyfluorene (PFO) polymers, and poly(p-phenylene vinylene (PPV) polymers. When the emitting layers 202 and 402 emit blue light, the dopant material included in the emitting layers 202 and 402 may be selected from a metal complex or an organometallic complex such as (4,6-F$_2$ppy)$_2$Irpic.

In an implementation, the first stack 200 may include a first emitting layer 202 which emits first color light. In an implementation, the second stack 400 may include a second emitting layer 402 which emits second color light. In an implementation, the first and second colors may be in a complementary color relationship with each other. In an implementation, the second color light may have a wavelength longer than that of the first color light. In an implementation, the first and second colors may be selected as a combination of colors capable of emitting a white color.

In an implementation, the first color light may be blue light and the second color light may be yellow-green light, or yellow light. In this case, the first emitting layer 202 may include a blue phosphorescent dopant material. The second emitting layer 402 may include a single yellow-green phosphorescent dopant material, or may include a mixture of a yellow phosphorescent dopant material and a green phosphorescent dopant material. In an implementation, the second emitting layer 402 may include a mixture of a red phosphorescent dopant material and a green phosphorescent dopant material.

In an implementation, the first and second colors may be selected as a combination of colors being able to emit white light, and each of the first and second emitting layers 202 and 402 may include phosphorescent dopant materials corresponding to the selected first and second colors.

Each of the first and second stacks 200 and 400 may further include a plurality of charge transport regions 201, 203, 401, and 403 to transport electrons or holes. The charge transport regions 201, 203, 401, and 403 may be a hole transport region to transport holes, or an electron transport region to transport electrons.

The hole transport region may include at least one of a hole injection layer, a hole transport layer, a buffer layer, and an electron blocking layer.

The hole transport region may be a single layer of a single material, or a single layer of a plurality of materials different from each other, or may have a multi-layer structure including a plurality of layers of a plurality of materials different from each other.

In an implementation, the hole transport region may have, e.g., a single layer structure in which a plurality of different materials are included, or a multi-layer structure having any of the following structures: hole injection layer/hole transport layer, hole injection layer/hole transport layer/buffer layer, hole injection layer/buffer layer, hole transport layer/buffer layer, and hole injection layer/hole transport layer/electron blocking layer in which the respective layers are sequentially stacked.

The hole transport region may be formed by using any of various methods, e.g., vacuum deposition, spin coating, casting, a Langmuir-Blodgett method, an inkjet printing method, a laser printing method, and a laser induced thermal imaging (LITI) method.

When the hole transport region includes a hole injection layer, the hole transport region may include, e.g., a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylaniine (m-MTDATA). 4,4',4"-Tris(N,N-diphenylamino)triphenylamine (TDATA), 4,4',4"-tris{N,-(2-naphthyl)-N-phenylamino}-triphenylamine (2TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), or (Polyaniline)/Poly(4-styrenesulfonate) (PANI/PSS).

When the hole transport region includes a hole transport layer, the hole transport region may include, e.g., a carbazole derivative such as N-phenyl carbazole, polyvinyl carbazole; a fluorine derivative; a triphenylamine derivative such as N,N'-bis(3-methylphenyl)-N,N'-diphenyl-[1,1-biphenyl]-4, 4'-diamine (TPD), 4,4',4"-tris(N-carbazolyl)triphenylamine (TCTA); N,N'-di(1-naphthyl)-N,N-diphenylbenzidine (NPB); and 4,4'-Cyclohexylidene bis[N,N-bis(4-methylphenyl)benzenamine] (TAPC).

A thickness of the hole transport region may range from, e.g., about 100 Å to about 1,000 Å or about 30 Å to about 300 Å. When the hole transport region includes both a hole injection layer and a hole transport layer, the thickness of the hole injection layer may range from, e.g., about 100 Å to about 10,000 Å or about 100 Å to about 1,000 Å, and the thickness of the hole transport layer may range from, e.g., about 50 Å to about 2,000 Å or about 100 Å to about 1,500 Å. When the thicknesses of the hole transport layer, the hole injection layer, and hole transport layer satisfy the above mentioned ranges, a satisfactory hole transport property may be obtained without a substantial rise in driving voltage.

The hole transport region may further include, e.g., a charge generating material to help improve the conductivity thereof, in addition to above-mentioned material(s). The charge generating material may be uniformly or non-uniformly dispersed in the hole transport region. The charge generating material may be, e.g., a p-dopant material. The p-dopant material may include, e.g., one of a quinine derivative, a metal oxide, and a cyano group-containing compound. In an implementation, the p-dopant material may include, e.g., a quinone derivative such as tetracyanoquinodimethane (TCNQ) or 2,3,5,6-tetrafluoro-tetracyanoquinodimethane (F4-TCNQ); and a metal oxide such as tungsten oxide or molybdenum oxide.

As previously mentioned, the hole transport region may further include at least one of a buffer layer or an electron blocking layer, in addition to the hole injection layer and the hole transport layer. The buffer layer may help enhance light emitting efficiency by compensating for a resonance distance according to a wavelength of light emitted from the emitting layer. A material included in the buffer layer may be one of the materials that may be included in the hole transport region. The electron blocking layer may help prevent electrons from being injected into the hole transport region from the electron transport region.

The electron transport region may include, e.g., at least one of a hole blocking layer, an electron transport layer, or an electron injection layer. In an implementation, the electron transport region may have, e.g., any of the following structures: electron transport layer/electron injection layer and hole blocking layer/electron transport layer/electron injection layer in which the respective layers are sequentially stacked, or a single-layer structure in which two or more layers of the above layers are mixed.

The electron transport region may be formed by using any of various methods, e.g., vacuum deposition, spin coating, casting, a Langmuir-Blodgett method, an inkjet printing method, a laser printing method, and a laser induced thermal imaging (LITI) method.

When the electron transport region includes an electron transport layer, the electron transport region may include, e.g., tris(8-hydroxyquinolinato)aluminum (Alq3), 1,3,5-Tri (1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate) (Bebq2), 9,10-di(naphthalene-2-yl) anthracene (ADN), or a mixture thereof.

The thickness of the electron transport layer may range from about 100 Å to about 1,000 Å, e.g., from about 150 Å to about 500 Å. When the thickness of the electron transport layer satisfies the above mentioned range, a satisfactory electron transport property may be obtained without a substantial rise in driving voltage.

When the electron transport region includes an electron injection layer, the electron transport region may include, e.g., LiF, LiQ (Lithium quinolate), Li2O, BaO, NaCl, CsF, a lanthanide metal such as Yb, or a metal halide such as RbCl, RbI. The electron injection layer may also include a material in which an electron transport material and an insulating organo metal salt are mixed. The organo metal salt may be a material having an energy band gap of about 4 eV or higher.

In an implementation, the organic metal salt may include metal acetate, metal benzoate, metal acetoacetate, metal acetylacetonate, or metal stearate.

The thickness of the electron injection layer may range from about 1 Å to about 100 Å, and in more detail, from about 3 Å to about 90 Å. When the thickness of the electron injection layer satisfies the above mentioned range, a satisfactory electron injection property may be obtained without a substantial rise in driving voltage.

The electron transport region may include the hole blocking layer as mentioned above. The hole blocking layer may include, e.g., at least one of 2,9-dimethyl-4,7-diphenyl-1,10-phenanthroline (BCP) or 4,7-diphenyl-1,10-phenanthroline (Bphen). The thickness of the hole blocking layer may range from about 20 Å to about 1,000 Å, e.g., from about 30 Å to about 300 Å. When the thickness of the hole blocking layer satisfies the above mentioned range, an excellent hole-blocking property may be obtained without a substantial rise in driving voltage.

The first stack 200 may include the charge transport regions 201 and 203 on both sides of the first emitting layer 202 that is positioned at a center thereof. For example, the first stack 200 may include the first charge transport region 201 between the first electrode 100 and the first emitting layer 202, and the second charge transport region 203 between the first emitting layer 202 and the charge generation region 300.

The first charge transport region 201 may be a hole transport region to transport holes provided from the first electrode 100 to the first emitting layer 202. The second charge transport region 203 may be an electron transport region to transport electrons provided from the charge generation region 300 to the first emitting layer 200.

The second stack 400 may include the third and fourth charge transport regions 401 and 403 on both sides of the second emitting layer 402 that is positioned at a center thereof. For example, the second stack 400 may include the third charge transport region 401 between the charge generation region 300 and the second emitting layer 402, and the fourth charge transport region 403 between the second emitting layer 402 and the second electrode 500.

The third charge transport region 401 may be a hole transport region to transport holes provided from the charge generation region 300 to the second emitting layer 402. The fourth charge transport region 403 may be an electron transport region to transport electrons provided from the second electrode 500 to the second emitting layer 402.

When the first electrode 100 is a cathode and the second electrode 500 is an anode, the first and third charge transport regions 201 and 401 may be electron transport regions and the second and fourth charge transport regions 203 and 403 may be hole transport regions.

In an implementation, the first charge transport region 201 may be an electron transport region to transport electrons provided from the first electrode 100 to the first emitting layer 202. The second charge transport region 203 may be a hole transport region to transport holes provided from the charge generation region 300 to the first emitting layer 202. The third charge transport region 401 may be an electron transport region to transport electrons provided from the charge generation region 300 to the second emitting layer 402. The fourth charge transport region 403 may be a hole transport region to transport holes provided from the second electrode 500 to the second emitting layer 402.

For example, functions of the first to fourth charge transport regions 201, 203, 401, and 403 may be determined depending on whether the first and second electrodes 100 and 500 are cathodes or anodes.

Each of the first to fourth charge transport regions 201, 203, 401, and 403 may be formed in a single layer as shown in FIG. 2, or may be formed in a multi-layer. When each of the first to fourth charge transport regions 201, 203, 401, and 403 is formed in a single layer, the first to fourth charge transport regions 201, 203, 401, and 403 may be formed by mixing or co-depositing a plurality of functional materials. In addition, the first to fourth charge transport regions 201, 203, 401, and 403 may be integrally formed with the emitting layers 202 and 402 of the corresponding stack 200 and 400.

The charge generation region 300 may generate a charge to provide the charge to the first and second stack 200 and 400. For example, the charge generation region 300 may include a charge generating material. In an implementation, the charge generation region 300 may generate a charge, and the charge generation region 300 may be referred to as a charge generation layer (CGL). In an implementation, the charge generation region 300 may balance charges between the first stack 200 and the second stack 400, and the charge generation region 300 may be referred to as an intermediate connection layer ICL. A more detailed description about the charge generation region 300 will be described later with reference to FIG. 3.

Figure 3:
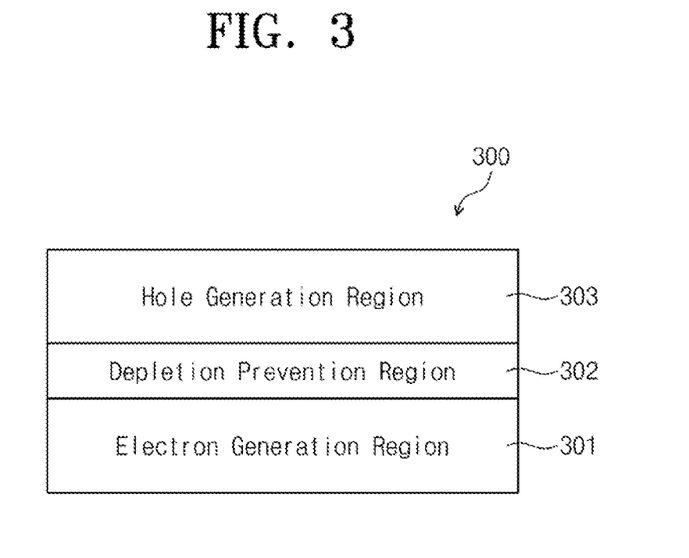
FIG. 3 illustrates a cross-sectional view of a charge generation region.

FIG. 3 illustrates a cross-sectional view of a charge generation region.

Referring to FIG. 3, the charge generation region 300 may include an electron generation region 301 to generate electrons to provide the generated electrons to an adjacent stack, and the hole generation region 303 to generate holes to provide the generated holes to an adjacent stack.

If the electron generation region 301 and the hole generation region 303 were to be stacked adjacent to each other, e.g., directly adjacent to each other, in the charge generation region 300, a depletion region could be formed by recombination of the generated electrons and holes. For example, when a potential difference applied to the charge generation region 300 increases, the depletion region could expand. When the depletion region expands, a driving voltage to drive a white organic light emitting diode 10 may undesirably increase. Therefore, the white organic light emitting diode 10 according to an embodiment may include a depletion prevention region 302 to prevent a depletion region from being formed between the electron generation region 301 and the hole generation region 303.

The depletion prevention region 302 may include, e.g., a diamond-like carbon (DLC) film, as a material to help prevent formation of a depletion region. In an implementation, a thickness of the DLC film may be, e.g., about 0.1 nm to about 10 nm.

In an implementation, the depletion prevention region 302 may include a carbon allotrope, e.g. a carbon nanotube or graphene, as another material to help prevent formation of a depletion region.

In an implementation, when the first electrode 100 is an anode and the second electrode 500 is a cathode, the charge generation region 300 may have a structure in which the electron generation region 301, the depletion prevention region 302, and the hole generation region 303 are sequentially stacked in the named order as shown in FIG. 3.

In an implementation, when the first electrode 100 is a cathode and the second electrode 500 is an anode, the charge generation region 300 may have a structure in which the hole generation region 303, the depletion prevention region 302, and the electron generation region 301 are sequentially stacked in the named order.

Figure 4:
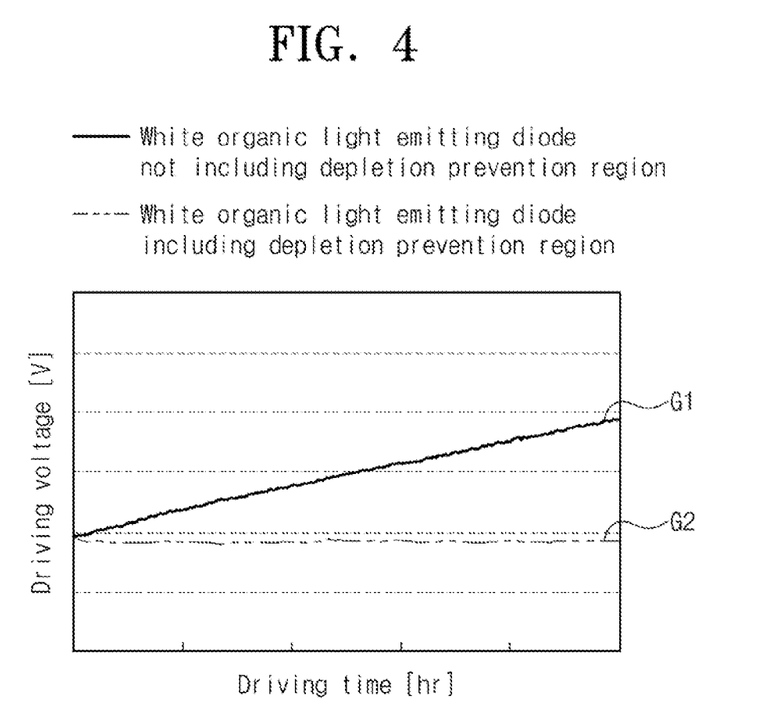
FIG. 4 illustrates graph showing change in driving voltage over time of a white organic light emitting diode not including the charge generation region of FIG. 3 and a white organic light emitting diode including the charge generation region of FIG. 3.

FIG. 4 illustrates graph showing change in driving voltage over time of a white organic light emitting diode not including a charge generation region (that includes a depletion prevention region) and a white organic light emitting diode including a charge generation region (that includes a depletion prevention region) of FIG. 3.

Referring to FIG. 4, it may be seen that in the case of the white organic light emitting diode that does not include the depletion prevention region, a driving voltage may increase over time (see G0). This is because the depletion region formed by recombination of holes and electrons may be enlarged.

On the other hand, it may be seen that in the case of the white organic light emitting diode 10 that does include the depletion prevention region 302, a driving voltage may be kept constant over time (see G2). This is because the depletion prevention region 302 may be provided between the hole generation region 303 and the electron generation region 301 to help prevent recombination of electrons and holes, thus helping to prevent the formation and expansion of the depletion region.

Figure 5:
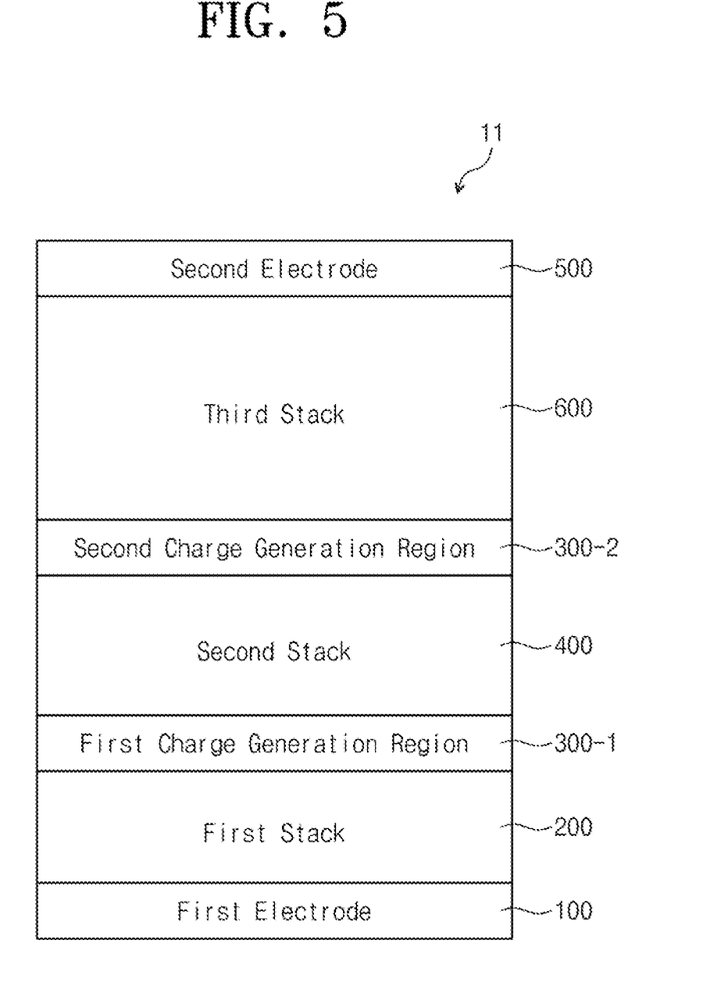
FIG. 5 illustrates a cross-sectional view of a white organic light emitting diode including first to third stacks.

FIG. 5 illustrates a cross-sectional view of a white organic light emitting diode including first to third stacks. For describing a white organic light emitting diode 11 shown in the FIG. 5, the descriptions made in relation to FIGS. 1 to 4 may be employed similarly, and repeated description may be omitted.

Referring to FIG. 5, the white organic light emitting diode 11 may include first and second electrodes 100 and 500, first to third stacks 200, 400, and 600, and first and second charge generation regions 300-1 and 300-2.

The first and second electrode 100 and 500 may correspond to an anode and a cathode, respectively. Hereinafter, for convenience of explanation, the white organic light emitting diode 11 in which the first electrode 100 is an anode, the second electrode 500 is a cathode will be described as reference.

Each of the first to third stacks 200, 400, and 600 may include first to third emitting layers to emit different colors from each other. For example, the first stack 200 may include a first emitting layer 202 to emit light of a first color, the second stack 400 may include a second emitting layer 402 to emit light of a second color, and the third stack 600 may include a third emitting layer to emit light of a third color, respectively. In an implementation, the first to third colors may be in a complementary color relationship with each other, e.g., at least one of the first to third colors may be complementary to another one of the first to third colors. In an implementation, the first to third colors may respond to blue, red, and green, respectively. In an implementation, the first emitting layer 202 may include a blue phosphorescent dopant material, the second emitting layer 402 may include a red phosphorescent dopant material, and the third emitting layer may include a green phosphorescent dopant material, respectively. In an implementation, the first to third colors may be selected as a combination of colors capable of emitting a white color. In an implementation, the first and third emitting layers may respectively include phosphorescent dopant materials corresponding to the selected first to third colors.

Each of the first to third stacks 200, 400, and 600 may include a plurality of charge transport regions (not shown). The charge transport regions may be an electron transport region or a hole transport region depending on adjacent electrodes 100 and 500 and charge generation regions 300-1 and 300-2, and this relationship may be the same as that described above with reference to FIG. 2.

The first and second charge generation regions 300-1 and 300-2 may generate charges to provide the charges to the first to third stack 200, 400, and 600. In an implementation, the first and second charge generation regions 300-1 and 300-2 may balance charges between the first stack 200 and the second stack 400.

The first and second charge generation region 300-1 and 300-2 may respectively include an electron generation region 301 to generate electrons, and a hole generation region 303 to generate holes. In an implementation, each of the first and second charge generation regions 300-1 and 300-2 may further include a depletion prevention region 302 to help prevent the formation of a depletion region caused by recombination of electrons and holes. In an implementation, the depletion prevention region 302 may include, e.g., a diamond-like carbon film. In an implementation, the depletion prevention region 302 may include, e.g., a carbon nanotube or graphene, that are carbon allotropes.

The first charge transport region 300-1 may provide electrons to the first stack 200, and holes to the second stack 400. Accordingly, the first charge generation region 300-1 may have a structure in which an electron generation region 301, a depletion prevention region 302, and a hole generation region 303 are sequentially stacked in the named order. The second charge generation region 300-2 may provide electrons to the second stack 400, and holes to the third stack 600. Accordingly, the second charge generation region 300-2 may have a structure in which an electron generation region 301, a depletion prevention region 302, and a hole generation region 303 are sequentially stacked in the named order.

When the first electrode 100 is a cathode and the second electrode 500 is an anode, the first charge generation region 300-1 may provide holes to the first stack 200, and electrons to the second stack 400. Accordingly, the first charge generation region 300-1 may have a structure in which a hole generation region 303, a depletion prevention region 302, and an electron generation region 301 are sequentially stacked in the named order. The second charge generation region 300-2 may provide holes to the second stack 400, and electrons to the third stack 600. Accordingly, the second charge generation region 300-2 may have a structure in which a hole generation region 303, a depletion prevention region 302, and an electron generation region 301 are sequentially stacked in the named order.

A white organic light emitting diode according to an embodiment may include a depletion prevention region in a charge generation region, and there may be an effect of preventing a driving voltage from rising, which may otherwise occur due to an expansion of the depletion region by recombination of electrons and holes.

By way of summation and review, an OLED may include a white organic light emitting diode having high luminescent efficiency. The white organic light emitting diode may be realized by including a plurality of organic light emitting materials which respectively emits red, green, and blue light in an emitting layer, or by including a pair of two organic light emitting materials in a complementary color relationship to each other.

When the white organic light emitting device is used, the color may be realized by using a color filter. In this case, organic emitting layers of all the sub-pixels may be formed in a same structure, and it may be relatively easy to manufacture a large-area and high resolution display device.

The embodiments may provide a white organic light emitting diode including a depletion prevention region.

The embodiments may provide a white organic light emitting diode which includes a depletion prevention region to prevent an expansion of a depletion region by recombination of electrons and holes in a charge generation region thereof to thus prevent a driving voltage of the white organic light emitting diode from rising.

Example embodiments have been disclosed herein, and although specific tell is are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A white organic light emitting diode, comprising:
   a first electrode;
   a second electrode facing the first electrode;
   a charge generation region between the first and second electrodes;
   a first emitting layer to emit light of a first color, the first emitting layer being between the first electrode and the charge generation region; and
   a second emitting layer to emit light of a second color, the second emitting layer being between the second electrode and the charge generation region,
   wherein the charge generation region includes:
      a hole generation region to generate holes,
      an electron generation region to generate electrons, and
      a depletion prevention region to prevent a depletion region from being generated by the holes and the electrons, the depletion prevention region being between the hole generation region and the electron generation region,
   wherein the depletion prevention region includes a carbon nanotube or a diamond-like carbon film.

2. The white organic light emitting diode as claimed in claim 1, wherein the depletion prevention region includes the diamond-like carbon film.

3. The white organic light emitting diode as claimed in claim 2, wherein a thickness of the diamond-like carbon film is 0.1 nm to 10 nm.

4. The white organic light emitting diode as claimed in claim 2, wherein the first and second colors are in a complementary color relationship with each other.

5. The white organic light emitting diode as claimed in claim 4, wherein a second wavelength of the second color is longer than a first wavelength of the first color.

6. The white organic light emitting diode as claimed in claim 5, wherein the first emitting layer includes a blue phosphorescent dopant material or a blue fluorescent dopant material.

7. The white organic light emitting diode as claimed in claim 6, wherein the second emitting layer includes a yellow phosphorescent dopant material.

8. The white organic light emitting diode as claimed in claim 7, wherein the second emitting layer includes a green phosphorescent dopant material.

9. The white organic light emitting diode as claimed in claim 6, wherein the second emitting layer includes red and green phosphorescent dopant materials.

10. The white organic light emitting diode as claimed in claim 2, further comprising a plurality of charge transport regions to transport the hole and the electron.

11. The white organic light emitting diode as claimed in claim 10, wherein the plurality of charge transport regions includes:
   a first charge transport region between the first electrode and the first emitting layer;
   a second charge transport region between the first emitting layer and the charge generation region;
   a third charge transport region between the charge generation region and the second emitting layer; and
   a fourth charge transport region between the second emitting layer and the second electrode.

12. The white organic light emitting diode as claimed in claim 11, wherein:
   the first electrode is an anode, and
   the second electrode is a cathode.

13. The white organic light emitting diode as claimed in claim 12, wherein:
   the first and third charge transport regions transport holes, and
   the second and fourth charge transport regions transport electrons.

14. The white organic light emitting diode as claimed in claim 11, wherein:
   the first electrode is a cathode, and
   the second electrode is an anode.

15. The white organic light emitting diode as claimed in claim 14, wherein:
   the first and third charge transport regions transport electrons, and the second and fourth charge transport regions transport holes.

16. The white organic light emitting diode as claimed in claim 1, wherein the depletion prevention region further includes graphene.

17. A white organic light emitting diode, comprising:
a first electrode;
a second electrode facing the first electrode;
first and second charge generation regions between the first and second electrodes;
a first emitting layer to emit light of a first color, the first emitting layer being between the first electrode and the first charge generation region;
a second emitting layer to emit light of a second color, the second emitting layer being between the first charge generation region and the second charge generation region; and
a third emitting layer to emit light of a third color, the third emitting layer being between the second charge generation region and the second electrode,
wherein each of the first and second charge generation regions includes:
a hole generation region to generate holes,
an electron generation region to generate electrons, and
a depletion prevention region to prevent a depletion region from being generated by the hole and the electron, the depletion prevention region being between the hole generation region and the electron generation region,
wherein the depletion prevention region includes a carbon nanotube or a diamond-like carbon film.

18. The white organic light emitting diode as claimed in claim 17, wherein the depletion prevention region includes the diamond-like carbon film.

19. The white organic light emitting diode as claimed in claim 17, wherein the depletion prevention region further includes graphene.

20. The white organic light emitting diode as claimed in claim 17, wherein the first and third colors are in a complementary color relationship with each other.

* * * * *